United States Patent
Sato

(10) Patent No.: US 7,989,816 B2
(45) Date of Patent: Aug. 2, 2011

(54) SEMICONDUCTOR DEVICE

(75) Inventor: Ken Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 160 days.

(21) Appl. No.: 12/471,015

(22) Filed: May 22, 2009

(65) Prior Publication Data

US 2009/0315075 A1    Dec. 24, 2009

(30) Foreign Application Priority Data

Jun. 23, 2008  (JP) ................................. 2008-163249

(51) Int. Cl.
*H01L 29/00*        (2006.01)

(52) U.S. Cl. .......... 257/73; 257/192; 257/194; 257/280; 257/E21.403

(58) Field of Classification Search ........................ None
See application file for complete search history.

(56) References Cited

U.S. PATENT DOCUMENTS

2005/0023555 A1   2/2005  Yoshida et al.
2009/0246924 A1*  10/2009 Niiyama et al. ............... 438/285

FOREIGN PATENT DOCUMENTS

WO    WO 03/071607 A1   8/2003

* cited by examiner

*Primary Examiner* — Evan Pert
*Assistant Examiner* — Scott Wilson
(74) *Attorney, Agent, or Firm* — Oblon, Spivak, McClelland, Maier & Neustadt, L.L.P.

(57) ABSTRACT

A semiconductor device is, constituted by: a nitride group semiconductor functional layer which includes a first nitride group semiconductor region, a second nitride group semiconductor region provided on the first nitride group semiconductor region by a hetero junction, and a two-dimensional carrier gas channel near the hetero junction of the first nitride group semiconductor region; a first main electrode and a second main electrode connected to the two-dimensional carrier gas channel by ohmic contact; and a gate electrode disposed between the first main electrode and the second main electrode. The nitride group semiconductor region has different thicknesses between the second main electrode and the gate electrode, and between the first main electrode and the gate electrode.

5 Claims, 5 Drawing Sheets

SEMICONDUCTOR DEVICE

CROSS REFERENCE TO RELATED APPLICATION

This application is based upon and claims the benefit of priority from the prior Japanese Patent Application No. 2008-163.249 filed on Jun. 23, 2008, the entire contents of which is incorporated herein by reference.

BACKGROUND OF THE INVENTION

1. Field of the Invention

The present invention relates to a semiconductor device, and more particularly to a semiconductor device which includes nitride group semiconductor functional layers.

2. Description of the Related Art

A high electron mobility transistor (HEMT) is popular as an electronic device including gallium nitride (GaN) group compound semiconductors. The HEMT has excellent carrier mobility and high-frequency characteristics.

The HEMT is constituted in a nitride group semiconductor functional layer which includes a GaN layer functioning as a channel layer and an aluminum gallium nitride (AlGaN) layer laid over the GaN layer by the hetero junction and functioning as a barrier layer. A two-dimensional electron gas channel (2DEG) where high speed carriers move is produced near the hetero junction of the GaN layer. A source electrode and a drain electrode are connected to the 2DEG channel by ohmic contact. A gate electrode is placed between the source and drain electrodes. The foregoing HEMT can accomplish high carrier density because of a piezoelectric field generated in response to intrinsic polarization and lattice mismatching. Such an HEMT is disclosed in WO 03/071607 A1.

In the foregoing publication, the barrier layer between the drain and gate electrodes, and a barrier layer between the gate and source electrodes So have the same thickness. It is seems that the cited invention does not seem to pay any consideration to the following: to modulate the carrier density in the 2DEG gas channel or the electric field to a channel direction, i.e. a carrier moving direction, by varying the thickness of the barrier layers.

The present invention has been contemplated in order to overcome the foregoing problem, and provides a semiconductor device in which a thickness of a barrier layer between drain and gate electrodes and a thickness of a barrier layer between gate and source electrodes are varied in order to modulate carrier density and electric field toward a carrier moving direction in a two-dimensional carrier gas channel generated in a nitride group semiconductor functional layer. Since the two-dimensional carrier gas channel has an expanse, the term "carrier density" may be replaced by the term "a width of two-dimensional carrier gas channel".

SUMMARY OF THE INVENTION

According to a feature of the embodiment of the invention, a semiconductor device includes: a nitride group semiconductor functional layer which includes a first nitride group semiconductor region, a second nitride group semiconductor region provided on the first nitride group semiconductor region by a hetero junction, and a two-dimensional carrier gas channel near the hetero junction of the first nitride group semiconductor region; a first main electrode and a second main electrode connected to the two-dimensional carrier gas channel by ohmic contact; and a gate electrode disposed between the first main electrode and the second main electrode. The second nitride group semiconductor region has different thicknesses between the second main electrode and the gate electrode, and between the first main electrode and the gate electrode.

With the foregoing semiconductor device, the first main electrode is a source electrode while the second main electrode is a drain electrode, and the second nitride group semiconductor region is thinner between the drain electrode and the gate electrode than between the source electrode and gate so electrode.

Further, the first main electrode is a source electrode while the second main electrode is a drain electrode, and the second nitride group semiconductor region is thicker between the drain electrode and the gate electrode than between the source electrode and the gate electrode.

The invention provides the semiconductor device in which a carrier density of a two-dimensional carrier gas channel generated in the nitride group semiconductor functional layer and an electric field can be modulated in a carrier moving direction by varying a thickness of a barrier layer between the drain electrode and gate electrode and a thickness of a barrier layer between the gate electrode and source electrode.

DETAILED DESCRIPTION OF THE INVENTION

Figure 1:
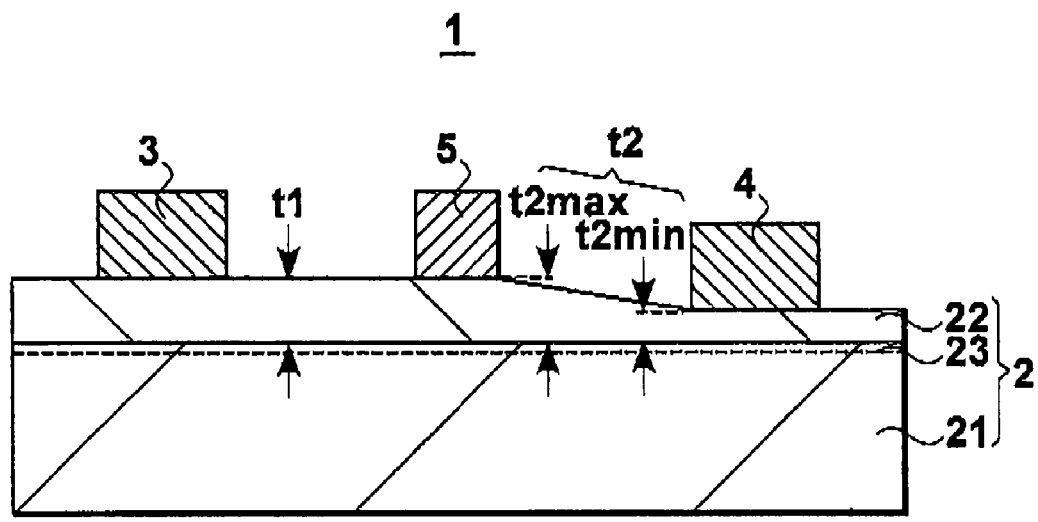
FIG. 1 is a cross sectional view of an essential part of a semiconductor device according to a first embodiment of the invention.

The invention will be described with reference to embodiments shown in the accompanying drawings. Like or corresponding parts are denoted by like or corresponding reference numerals. The drawings are schematic and may sometimes differ from actual components. Further, dimensions of components may be different in some drawings.

While the invention is described by means of specific embodiments and applications thereof, numerous modifications and variations could be made thereto without departing from the scope of the invention set forth in the claims.

First Embodiment

In a first embodiment, the invention is applied to an HEMT 1 as a semiconductor device, in which the HEMT 1 is relatively free from current collapse.

[Composition of HEMT]

Referring to FIG. 1, the HEMT (semiconductor device) 1 is constituted in a nitride group semiconductor functional layer 2; a first main electrode 3 and a second main electrode 4; and a gate electrode 5. The nitride group semiconductor functional layer 2 includes a first nitride group semiconductor region 21 functioning as a carrier region (channel region); a second nitride group semiconductor region (barrier region) 22 which is present on the first nitride group semiconductor region 21, and functions as a carrier producing region with few lattices compared to the first nitride group semiconductor region 21, having a large band gap, and being provided by the hetero junction causing tensile strength. Further, the nitride group semiconductor functional layer 2 has a two-dimensional carrier gas channel (two-dimensional electron gas layer or two-dimensional hole gas layer) 23 near the hetero junction of the first nitride group semiconductor region 21. The first and second main electrodes 3 and 4 are connected to a two-dimensional carrier gas channel 23 by ohmic contact. The gate electrode 5 is positioned between the first and second main electrodes 3 and 4 of the second nitride group semiconductor 22. The first main electrode 3 functions as a source electrode while the second main electrode 4 functions as a drain electrode. Although not shown clearly, an area between the first main electrode 3 and the gate electrode 5 is shorter than an area between the second main electrode 4 and the gate electrode 5.

The nitride group semiconductor functional layer 2 is directly formed on a silicon, silicon carbide, or sapphire substrate or the like, or is indirectly formed on a substrate via a buffer layer in order to match crystalline characteristics. The nitride group semiconductor functional layer 2 is composed of a III—group nitride semiconductor material, which is typically denoted by $Al_xIn_yGa_{1-x-y}N$ ($0 \leq x \leq 1$, $0 \leq y \leq 1$, $0 \leq x+y \leq 1$). The first nitride group semiconductor region 21 of the nitride group semiconductor functional layer 2 is an Na layer while the second nitride group semiconductor region 22 is an AlGaN layer.

In this embodiment, the first nitride group semiconductor region 21 is 0.5 μm to 10.0 μm thick, for instance. The GaN layer is 0.5 μm to 3.5 μm thick, for instance. The second nitride group semiconductor region 22 has a thickness t1 between the first main electrode 3 and the gate electrode 5. The thickness t1 is 5.0 nm to 100.0 nm, for instance. The AlGaN layer of the second nitride group semiconductor region 22 has a thickness t2 between the second main electrode 4 and the gate electrode 5. The thickness t2 ranges between t2max and t2min, e.g. 5.0 nm to 15.0 nm.

In the nitride group semiconductor functional layer 2, the two-dimensional carrier gas channel 23 resulting from the intrinsic polarization and piezo polarization of the first and second nitride group semiconductor regions 21 and 22 is produced near the surface of the first nitride group semiconductor region 21, i.e. near the hetero junction interface of the first and second nitride group semiconductor regions 21 and 22. The two-dimensional carrier gas channel 28 functions as a carrier channel region having high speed mobility in the HEMT 1.

The first and second main electrodes 3 and 4 are ohmic electrodes connected to the two-dimensional carrier gas channel 23 with low resistance. A potential which is higher than a potential applied to the first main electrode 3 is applied to the second main electrode 4, so that the gate electrode 5 is activated. In this state, a current flows to the first main electrode 3 from the second electrode 4 (while electrons, or carriers, flow in a reverse direction). Each of the first and second main electrodes 3 and 4 is constituted by a titanium (Ti) layer which is 10 nm to 50 nm thick, and an aluminum (Al) layer which is laid on the Ti layer, and is 100 nm to 1000 nm thick. The second main electrode 4 is placed on a part having the thickness t2min of the second nitride group semiconductor region 22 while the first main electrode 3 is placed on a part of the second nitride group semiconductor region 22 having the thickness t1. The thickness t1 is larger than the thickness t2min.

On a part of the second nitride group semiconductor region 21 having the thickness t1, the gate electrode 5 is connected to the two-dimensional gas carrier gas channel 23 by the Shottkey contact. The gate electrode 5 is constituted by a nickel (Ni) layer which is 100 nm to 500 nm thick, and a gold (Au) layer which is laid on the Ni layer, and has a thickness of 0.1 μm to 1.0 μm.

In the foregoing HEMT 1, the second nitride group semiconductor region 22 has the thickness t2 between the second main electrode 4 and the gate electrode 5.

[Operation Principle of HEMT]

The second nitride group semiconductor region 22 has the thickness t1 between the first main electrode 3 and the gate electrode 5. The second nitride group semiconductor region 22 is gradually thinned between the gate electrode 5 and the second main electrode 4, i.e. has the thickness t2. In other words, the second nitride group semiconductor region 22 is thick near the first electrode 3, and becomes thin toward the second main electrode 4. The second nitride group semiconductor region 22 is asymmetrical. A carrier density of the two-dimensional carrier gas channel 23 depends upon an intensity of an electric field produced in response to the intrinsic polarization and piezo polarization. The carrier density of the two-dimensional carrier gas channel 23 becomes lower at the area where the second nitride group semiconductor region 22 has the thickness t2

Figure 2:
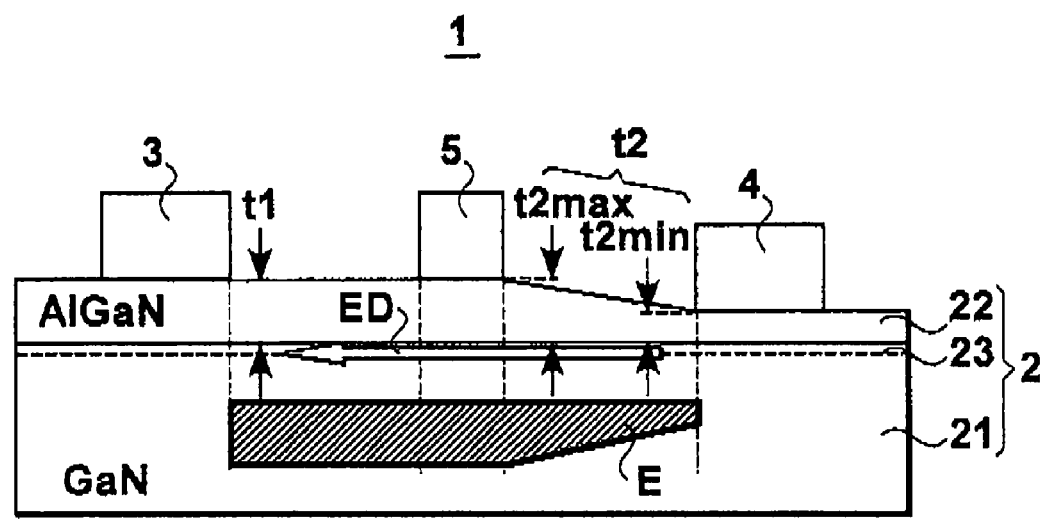
FIG. 2 is a schematic cross sectional view of the semiconductor device of FIG. 1, showing distribution of an electric field of the semiconductor device.
Figure 3:
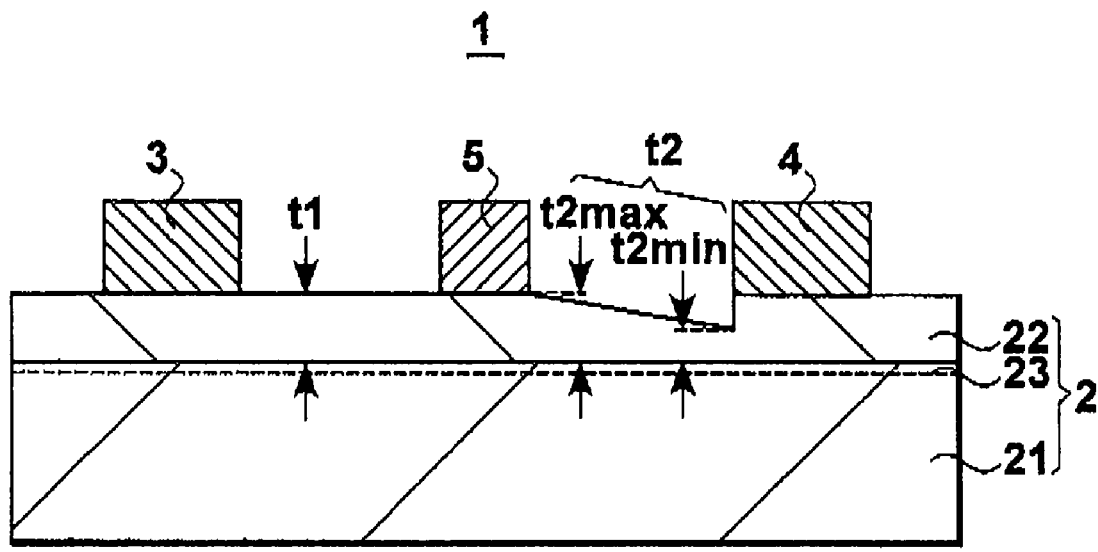
FIG. 3 is a cross sectional view of an essential part of a semiconductor device in a first modified example of the first embodiment.

Referring to FIG. 2, a field intensity E resulting from the intrinsic polarization and piezo polarization is low at the part of the second nitride group semiconductor region 22 having the thickness t2 compared to a field intensity at another part of the second nitride group semiconductor region 22 having the thickness of t1. Therefore, when the HEMT 1 is in an off-state by applying a voltage to make the potential of the second main electrode 4 higher than the potential of the first main electrode 3, the field intensity at the second main electrode 4 is usually raised. In the first embodiment, the field intensity caused by the intrinsic polarization and piezo polarization is controlled, which makes a field intensity distribution more smooth or uniform than a field intensity distribution of the related art. The HEMT 1 can reduce hot electrons near the second main electrode 4 (drain electrode), which is effective in suppressing the current collapse.

Further, in the HEMT 1, the field intensity E of the second nitride group semiconductor region 22 at the one end of the gate electrode 5 facing with the second main electrode 4 can be reduced compared to the field intensity E of the second nitride group semiconductor region 22 at the first main electrode 3. This is effective in enabling the HEMT 1 to have a high withstand voltage.

[Method of Fabricating HEMT]

The HEMT1 will be fabricated as follows. No particular drawings will be referred to here. The HEMT 1 can be easily fabricated by etching the second nitride group semiconductor region 22 using a resist (mask). More specifically, the second nitride group semiconductor region 22 is formed all over the first nitride group semiconductor region 21. Then, the resist is made. The surface of the second nitride group semiconductor region 22 is etched by side-etching the resist in such a manner that the second nitride group semiconductor region 22 is gradually thinned between the second main electrode 4 and the gate electrode 5. The second nitride group semiconductor region 22 is sloped between the second main electrode 4 and the gate electrode 5.

Features of First Embodiment

As described above, with the HEMT 1 of the first embodiment, the carrier density and field intensity E of the two-dimensional carrier gas channel 23 produced in the nitride group semiconductor functional layer 2 can be modulated in the carrier moving direction. The HEMT 1 can reduce hot electrons near the second main electrode 4, and suppress generation of the current collapse. Further, the HEMT 1 can lower the field intensity E at the end of the gate electrode 5, and raise the withstand voltage.

FIRST MODIFIED EXAMPLE

The HEMT 1 of the first embodiment is modified as follows in first to fifth examples. Specifically, the cross sectional profile of the HEMT 1 is modified.

In the first modified example, the second nitride group semiconductor region 22 is gradually thinned between the gate electrode 5 and the second main electrode 4, and has the thickness t2min at the side of the second main electrode 4 facing with the gate electrode, and the thickness t2max under the second main electrode 4. In this example, the thickness t2max is approximately equal to the thickness t1 of the second nitride group semiconductor region 22 between the first main electrode and the gate electrode 5.

The HEMT 1 of the first modified example is as effective and advantageous as the HEMT1 of the first embodiment.

SECOND MODIFIED EXAMPLE

Figure 4:
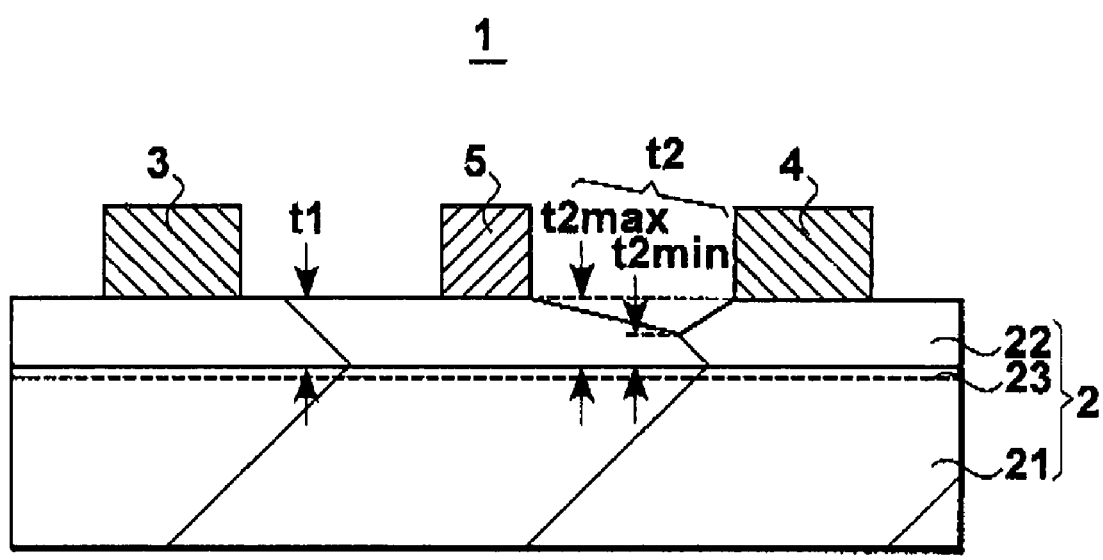
FIG. 4 is a cross sectional view of an essential part of a semiconductor device in a second modified example of the first embodiment.

An HEMT 1 of a second modified example is essentially similar to the HEMT 1 of the first embodiment. Referring to FIG. 4, the second nitride group semiconductor region 22 has the thickness t2max between the first main electrode 3 and the gate electrode 5, and is gradually thinned toward the second main electrode 4. Specifically, the second nitride group semiconductor region 22 is thinnest (having the thickness t2min) between the gate electrode 5 and the second main electrode 4. Thereafter, the second nitride group semiconductor region 22 is thickened toward the second main electrode 4, and becomes thickest (having the thickness t2max) under the second main electrode 4. The thinnest part of the nitride group semiconductor region 22 may be positioned near the second main electrode 4, at the center between the second main electrode 4 and the gate electrode 5, or near the gate electrode 5.

In the HEMT 1 of the second modified example, the thinnest part of the nitride group semiconductor region 22 can temporarily reduce the field intensity E due to the intrinsic polarization and piezo polarization, and temporally decelerate the carriers. This is effective in keeping relatively low on-state resistance and suppressing the current collapse as in the first embodiment.

THIRD MODIFIED EXAMPLE

Figure 5:
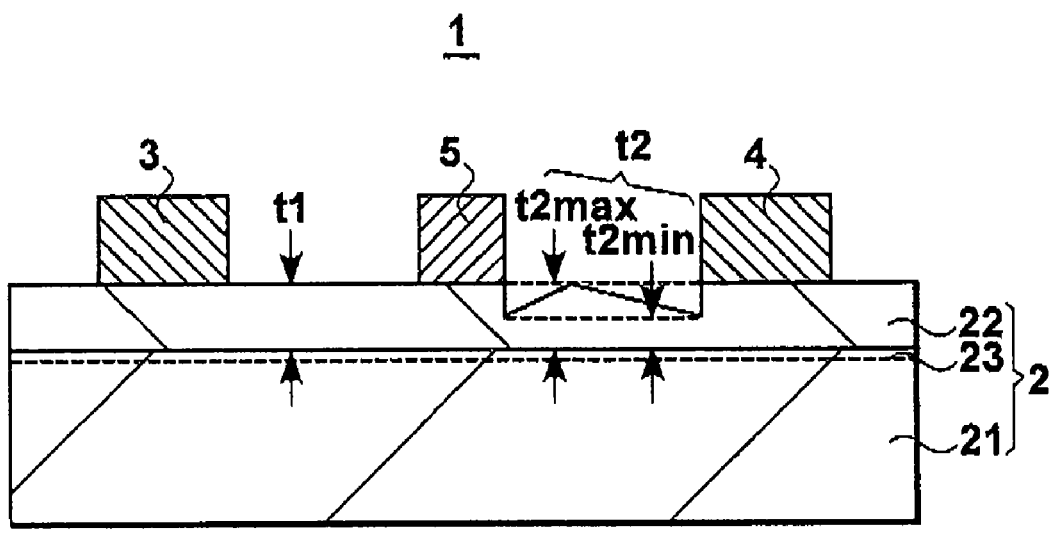
FIG. 5 is a cross sectional view of an essential part of a semiconductor device in a third modified example of the first embodiment.

An HEMT 1 of a third modified example is essentially similar to the HEMT 1 of the first embodiment. Referring to FIG. 5, the second nitride group semiconductor region 22 has the thickness t2max between the first main electrode 3 and the gate electrode 5, is thinned to have the thickness t2min at one end of the gate electrode 5, is then thickened to have the thickness t2max at the center between the gate electrode 5 and one end of the second main electrode 4, is then thinned at one end of the second main electrode 4 (having the thickness t2max), and is finally thickened to the thickness t2max under the second main electrode 4. In this modified example, the thickest part of the second nitride group semiconductor 22 may be near the gate electrode 5, or at the center between the gate electrode 5 and the second main electrode 4. Further, the second main electrode 4 is positioned on the second nitride group semiconductor region 22 which has the thickness t2max.

In the HEMT 1 of the third modified example, the second nitride group semiconductor region 22 has the thickness t2min at the one end of the gate electrode 5 and at the one end of the second main electrode 4. This is effective in temporally minimizing the filed intensity E at the thinnest part of the second nitride group semiconductor region 22, temporally decelerating carriers, keeping relatively low on-resistance, and suppressing the current collapse as in the HEMT 1 of the first embodiment.

Second Embodiment

Figure 6:
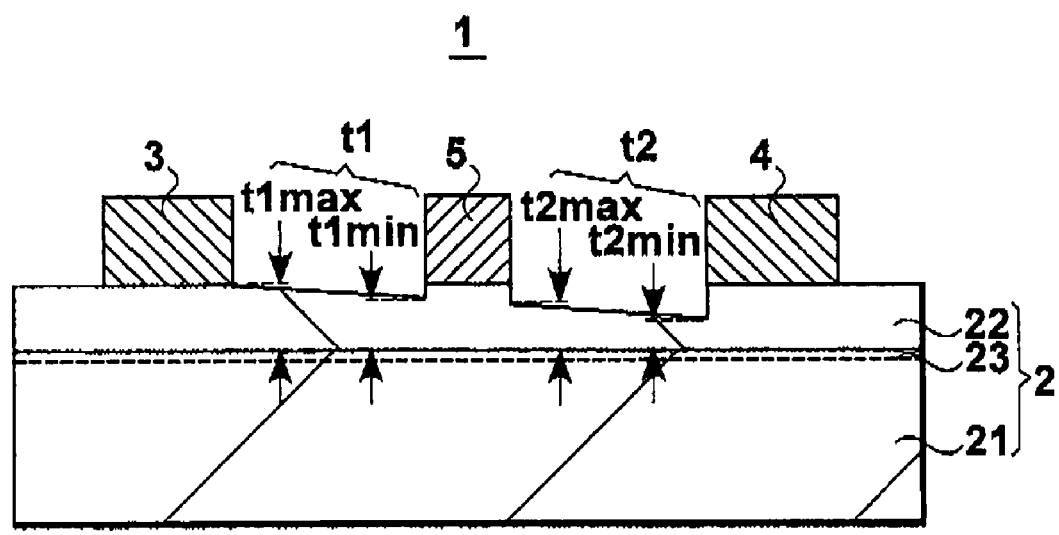
FIG. 6 is a cross sectional view of an essential part of a semiconductor device according to a second embodiment.

As shown in FIG. 6, an HMET 1 of a second embodiment includes a second nitride group semiconductor region 22 whose cross sectional profile differs from that of the first embodiment.

[Composition of HEMT]

Referring to FIG. 6, the HMET 1 of the second embodiment is structured similarly to the HEMT 1 of the first embodiment. The second nitride group semiconductor region 22 has the thickness t1 between the first main electrode 3 and the gate electrode 5, and the thickness t2 between the second main electrode 4 and the gate electrode 5.

Further, the second nitride group semiconductor region 22 essentially has the thickness t1, and more particularly has the thickness t1max at one end of the first main electrode 3 facing with the gate electrode 5, and is gradually thinned to have the thickness t1min near one end of the gate electrode 5 facing with the first main electrode 3. Further, at the area where the thickness is t2, the second nitride group semiconductor region 22 is thickened to have the thickness t2max at the one side of the gate electrode 5 facing with the second main electrode 4. Thereafter, the second nitride group semiconductor region 22 is gradually thinned to have the thickness t2min at one end of the second main electrode 4 facing with the gate electrode 5. In other words, the thickness t2max is smaller than the thickness t1min. The second nitride group semiconductor region 22 is sloped and becomes thinner between the one end of the first main electrode 3 facing with the gate electrode 5 and the second main electrode 4 facing with the gate electrode 5.

In the second embodiment, the first main electrode 3, gate electrode 5 and second main electrode 4 are positioned on the second nitride group semiconductor region 22 having the thickness t1max.

Features of Second Embodiment

As described above, with the HEMT 1 of the second embodiment, the carrier density and field intensity E of the two-dimensional carrier gas channel 23 produced in the nitride group semiconductor functional layer 2 can be modulated to the carrier moving direction. When a voltage is applied to turn the HEMT 1 off, a potential of the second main electrode 4 is higher than a potential of the first main electrode 3. With the related art, a field intensity at the second main electrode 4 is raised. However, in the HEMT 1 of the second embodiment, the field intensity resulting from the intrinsic polarization and piezo polarization can be controlled in order to make the field intensity be distributed smoothly or uniformly as shown in FIG. 2 showing the distribution of the field intensity. Still further, the HEMT 1 can reduce hot electrons near the second main electrode 4, and suppress generation of the current collapse. Further, the HEMT 1 can lower the field intensity E at the end of the gate electrode 5, and raise the withstand voltage.

Third Embodiment

In a third embodiment, the present invention is applied to an HEMT 1 as a semiconductor device, and the HEMT 1 is devised to accelerate the carriers.

[Composition of HEMT]

Figure 7:
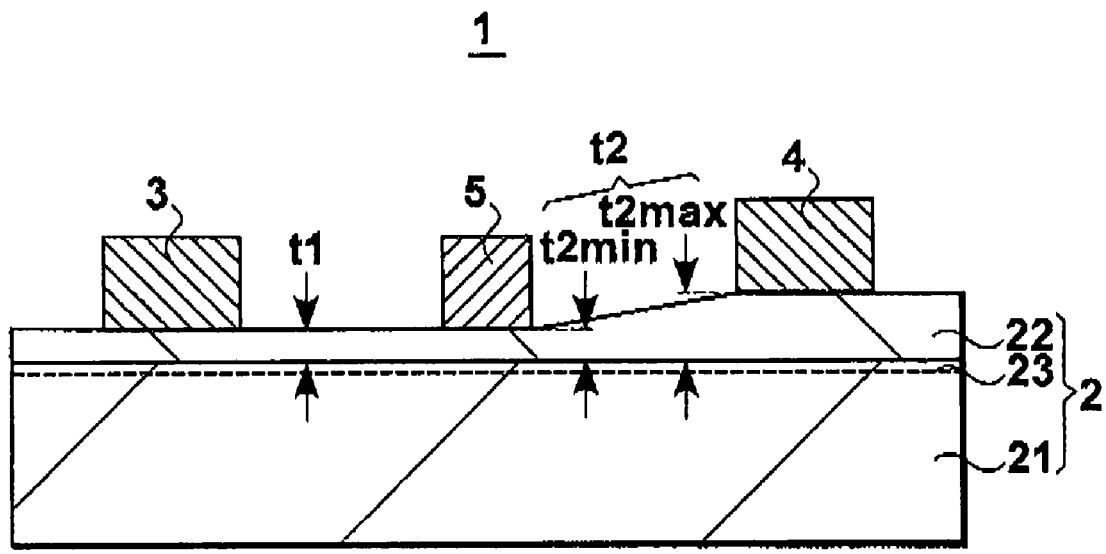
FIG. 7 is a cross sectional view of an essential part of a semiconductor device according to a third embodiment.

Referring to FIG. 7, a structure of the HEMT 1 is essentially similar to that of the HEMT 1 of the second embodiment. The second nitride group semiconductor region 22 has the thickness t1 between the first main electrode 3 and the gate electrode 5, and has the thickness t2 between the second main electrode 4 and the gate electrode 5.

The second nitride group semiconductor region 22 has the thickness t2min at one side of the gate electrode 5 facing with the second main electrode 4, and has the thickness t2max at one side of the second main electrode 4 facing with the gate electrode 5. In other words, the second nitride group semiconductor region 22 is gradually sloped and thickened toward the second main electrode 4.

[Operation Principle of HEMT]

In the third embodiment, the second nitride group semiconductor region 22 has the different thicknesses between the first main electrode 3 and the gate electrode 5, and between the gate electrode 5 and the second main electrode 4. Therefore, the second nitride group semiconductor region 22 suffers from a warp, varying field intensity (resulting from the intrinsic polarization and piezo polarization), and varying carrier density E, at the two-dimensional carrier gas channel 23 between the first main electrode 3 and the gate electrode 5, and between the gate electrode 5 and the second main electrode 4. Since the second nitride group semiconductor region 22 is thick near the second main electrode 4, the carrier density of the two-dimensional carrier gas channel 28 is increased.

Figure 8:
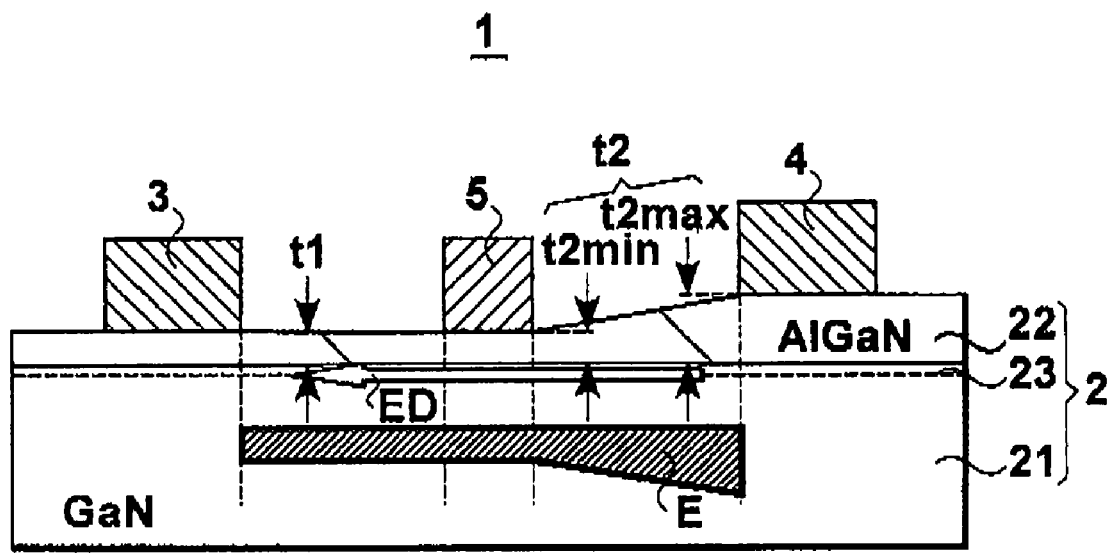
FIG. 8 is a schematic sectional view of the semiconductor device of FIG. 7, showing distribution of an electric field of the semiconductor device.

As shown in FIG. 8, the field intensity E is increased at the two-dimensional carrier gas channel 23 where the second nitride group semiconductor region 22 has the thickness t2. In short, it is possible to increase (modulate) the field intensity E in a direction opposite to an electric field direction ED toward the gate electrode 5 from the second main electrode 4 (the moving direction of the carriers). Since the carriers of two-dimensional carrier gas channel 23 move, at an accelerated speed near the second main electrode 4 (drain electrode), the HEMT 1 can raise a switching speed.

The HEMT 1 of the third embodiment is fabricated similarly to the HEMT 1 of the first embodiment. Therefore, a fabrication method will not be referred to here. Further, the HEMT 1 of this embodiment can be modified to have the cross sectional profile which is the same as the cross sectional profiles of the HEMTs 1 of the first to fifth modified examples in the first embodiment, and the cross sectional shape of the HEMT 1 of the second embodiment.

Features of Third Embodiment

With the HEMT 1 of the third embodiment, it is possible to modulate, in the carrier moving direction, the carrier density and field intensity E of the two-dimensional gas channel 23 produced in the nitride group semiconductor functional layer 2. Therefore, the field intensity E near the second main electrode 4 can be raised, and the carriers of the two-dimensional gas channel 23 can be accelerated. This is effective in accelerating the switching speed.

Fourth Embodiment

In a fourth embodiment, the invention is applied to a Schottkey barrier diode (SBD) 11 as a semiconductor device. The SBD can increase the withstand voltage.

[Composition of SBD]

Figure 9:
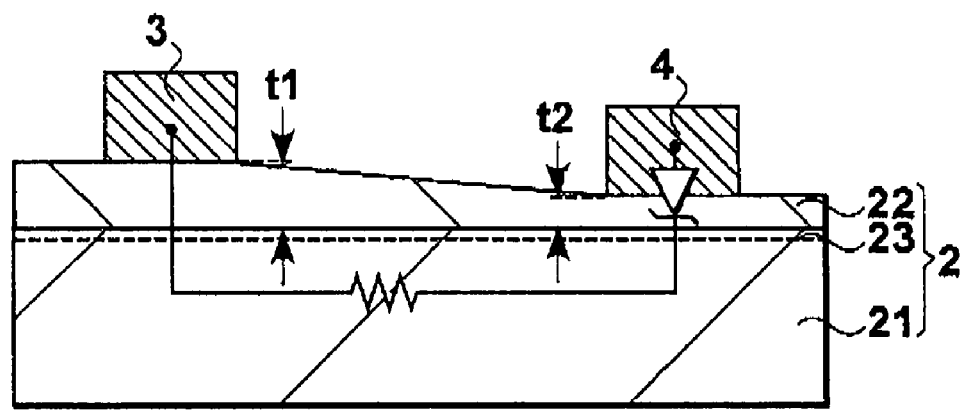
FIG. 9 is a cross sectional view of an essential part of a semiconductor device according to a fourth embodiment.

Referring to FIG. 9, the SBD 11 is constituted by a first nitride group semiconductor functional layer 2, a first main electrode 3 and a second main electrode 4. The nitride group semiconductor functional layer 2 includes a first nitride group semiconductor region 21, a second nitride group semiconductor region 22, and a two-dimensional carrier gas channel 23 which is positioned on the second nitride group semiconductor region 22. The second nitride group semiconductor region 22 is placed on the first nitride group semiconductor region 21 by the hetero junction The first and second main electrodes 3 and 4 are positioned on the second nitride group semiconductor region 22 with a space maintained between them. The second nitride group semiconductor region 22 has the thickness t1 near the first main electrode 3, and has the thickness t2 near the second main electrode 4. The thickness t2 is smaller than the thickness t1. In this embodiment, the first main electrode 3 functions as a cathode electrode for ohmic contact with the two-dimensional carrier gas channel 23. The second main electrode 4 functions as an anode electrode for Schottkey junction with the two-dimensional carrier gas channel 23.

The nitride group semiconductor functional layer 2 is structured similarly to the nitride group semiconductor functional layer 2 of the HEMT 1 in the first embodiment.

In the SBD 11, an electric field tends to concentrate near the second main electrode 4 (cathode electrode) which is subject to the Schottkey junction. Therefore, the second nitride group semiconductor region 22 has the thickness t2 near the second main electrode 4. This is effective in reducing not only the carrier density but also the field intensity E near the second main electrode 4 of the two-dimensional gas channel 23.

According to the fourth embodiment, the second nitride group semiconductor region 22 of the SBD 11 may have the cross sectional profile which is similar to that of the second nitride group semiconductor region 22 of the HEMTs 1 in the first to third modified examples of the first embodiment.

Features of Fourth Embodiment

With the SBD 11 of the fourth embodiment, it is possible to modulate the carrier density and field intensity E of the two-dimensional carrier gas channel 28 (produced in the nitride group semiconductor functional layer 2) in the carrier moving direction. Therefore, the field intensity E can be reduced near the second main electrode 4 in the SBD 11, so that the withstand voltage can be improved.

MODIFIED EXAMPLE

Figure 10:
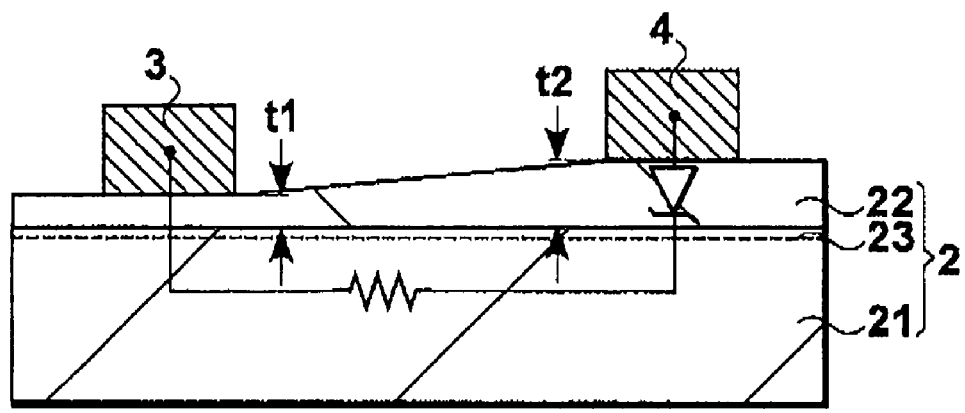
FIG. 10 is a cross sectional view of an essential part of a semiconductor device in a modified example of the fourth embodiment

Referring to FIG. 10, an SBD 11 of a modified example is structured similarly to the SBD11 shown in FIG. 9. However, the second nitride group semiconductor region 22 has the thickness t1 near the first main electrode 3, and has the thickness t2 near the second main electrode 4.

With the SBD 11 in the modified example, the carrier density and field intensity E produced in the nitride group semiconductor functional layer 2 can be modulated in the carrier moving direction. Therefore, the field intensity E can be raised near the second main electrode 4, and carriers in the two-dimensional carrier gas channel 23 can be accelerated near the second main electrode 4. This is effective in accelerating the switching operation.

Other Embodiments

While the invention has been described by means of specific embodiments and applications thereof, numerous modifications and variations could be made thereto without departing from the scope of the invention set forth in the claims.

For instance, the first main electrode 3, second main electrode 4 and gate electrode 5 may have their bottom embedded in the first nitride group semiconductor region 21. Further, the gate electrode 5 may be in the shape of a well-known recess gate.

Still further, the nitride group semiconductor region 22 may be thickened from a side opposite to the first main electrode 3 facing with the second main electrode 4.

What is claimed is:

1. A semiconductor device comprising:
   a nitride group semiconductor functional layer which includes
      a first nitride group semiconductor region,
      a second nitride group semiconductor region provided on the first nitride group semiconductor region by a heterojunction, and
      a two-dimensional carrier gas channel near the heterojunction of the first nitride group semiconductor region;
   a first main electrode connected to the two-dimensional carrier gas channel by ohmic contact;
   a second main electrode connected to the two-dimensional carrier gas channel by ohmic contact; and
   a gate electrode disposed between the first main electrode and the second main electrode,
   wherein the second nitride group semiconductor region is thinner between the second main electrode and the gate electrode than between the first main electrode and the gate electrode.

2. The semiconductor device defined in claim 1, wherein a surface between the first main electrode and the gate electrode of the second nitride group semiconductor region is a slope where a film thickness of the second nitride group semiconductor region changes for the heterojunction plane rectilinear.

3. The semiconductor device defined in claim 1, wherein a surface between the second main electrode and the gate electrode of the second nitride group semiconductor region is a slope where a film thickness of the second nitride group semiconductor region changes for the heterojunction plane rectilinear.

4. A semiconductor device comprising:
   a nitride group semiconductor functional layer which includes a first nitride group semiconductor region, a second nitride group semiconductor region provided on the first nitride group semiconductor region by a heterojunction, and a two-dimensional carrier gas channel near the heterojunction of the first nitride group semiconductor region;
   a first main electrode connected to the two-dimensional carrier gas channel by ohmic contact; and
   a second main electrode connected to the two-dimensional carrier gas channel by Schottky junction, and formed a Schottky barrier diode;
   wherein the second nitride group semiconductor region has different thicknesses which is the thickness near the first main electrode is smaller than the thickness near the second main electrode.

5. A semiconductor device comprising:
   a nitride group semiconductor functional layer which includes a first nitride group semiconductor region, a second nitride group semiconductor region provided on the first nitride group semiconductor region by a heterojunction, and a two-dimensional carrier gas channel near the heterojunction of the first nitride group semiconductor region;
   a first main electrode connected to the two-dimensional carrier gas channel by ohmic contact; and
   a second main electrode connected to the two-dimensional carrier gas channel by Schottky junction, and formed a Schottky barrier diode;
   wherein the second nitride group semiconductor region has different thicknesses which is the thickness near the second main electrode is smaller than the thickness near the first main electrode.

* * * * *